(12) United States Patent
Taghizadeh Kaschani et al.

(10) Patent No.: US 10,439,024 B2
(45) Date of Patent: Oct. 8, 2019

(54) INTEGRATED CIRCUIT WITH TRIPLE GUARD WALL POCKET ISOLATION

(71) Applicants: Texas Instruments Incorporated, Dallas, TX (US); Texas Instruments Deutschland GmbH, Freising (DE)

(72) Inventors: Karim-Thomas Taghizadeh Kaschani, Freising (DE); Antonio Gallerano, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/180,592

(22) Filed: Jun. 13, 2016

(65) Prior Publication Data

US 2017/0358570 A1    Dec. 14, 2017

(51) Int. Cl.
*H01L 27/02* (2006.01)
*H01L 29/06* (2006.01)

(52) U.S. Cl.
CPC ........ *H01L 29/0623* (2013.01); *H01L 27/027* (2013.01); *H01L 27/0248* (2013.01); *H01L 27/0255* (2013.01); *H01L 27/0262* (2013.01); *H01L 27/0285* (2013.01)

(58) Field of Classification Search
CPC ............. H01L 27/0262; H01L 27/0255; H01L 29/0623; H01L 29/0619; H01L 27/0248; H01L 27/0259; H01L 27/0266; H01L 27/0285; H01L 27/0251; H01L 27/027; H01L 27/0274; H01L 27/0277; H01L 27/0617–0635
See application file for complete search history.

(56) References Cited

U.S. PATENT DOCUMENTS

| | | | | |
|---|---|---|---|---|
| 7,763,941 B2 * | 7/2010 | Kim | ..................... | H01L 27/0251 257/355 |
| 8,476,736 B2 * | 7/2013 | Lee | ..................... | H01L 27/0255 257/547 |
| 8,610,251 B1 * | 12/2013 | Salcedo | ................ | H01L 29/747 257/173 |
| 8,637,899 B2 * | 1/2014 | Salcedo | .............. | H01L 27/0262 257/173 |
| 8,830,640 B2 | 9/2014 | Taghizadeh Kaschani | | |
| 2004/0227192 A1 * | 11/2004 | Yoshida | .......... | H01L 21/823892 257/371 |
| 2008/0218922 A1 * | 9/2008 | Mallikararjunaswamy | ................. | H01L 27/0262 361/91.6 |

(Continued)

*Primary Examiner* — Allen L Parker
*Assistant Examiner* — Pauline Vu
(74) *Attorney, Agent, or Firm* — Jacqueline J. Garner; Charles A. Brill; Frank D. Cimino

(57) ABSTRACT

A semiconductor device includes a substrate having a semiconductor surface doped a second dopant type with a buried layer (BL) doped a first dopant type. First, second and third well regions doped the second dopant type are on top of the BL. Second doped regions doped the first dopant type on top of and contacting the BL arraigned as a first well ring and second well ring are around the first and third well regions respectively. At least one high-injection component including the first well region is surrounded by the first well ring. At least one component including the third well region is surrounded by the second well ring. An npn or pnp guard wall pocket including a wall of the first and second well rings, and the second well region is between the high-injection component and the component.

10 Claims, 5 Drawing Sheets

(56) References Cited

U.S. PATENT DOCUMENTS

| | | | |
|---|---|---|---|
| 2009/0040670 A1* | 2/2009 | Van Camp | H01L 27/0255 361/56 |
| 2009/0108406 A1* | 4/2009 | Sato | H01L 27/0262 257/566 |
| 2010/0289057 A1* | 11/2010 | Sheu | H01L 27/0251 257/133 |
| 2011/0058293 A1* | 3/2011 | Pardoen | H01L 27/0251 361/56 |
| 2011/0303947 A1* | 12/2011 | Salcedo | H01L 27/0259 257/173 |
| 2012/0007207 A1* | 1/2012 | Salcedo | H01L 27/0259 257/491 |
| 2012/0044732 A1* | 2/2012 | Li | H01L 21/76283 363/147 |
| 2012/0199874 A1* | 8/2012 | Salcedo | H01L 27/0262 257/120 |
| 2012/0205714 A1* | 8/2012 | Salcedo | H01L 21/8222 257/140 |
| 2013/0032882 A1* | 2/2013 | Salcedo | H01L 27/0262 257/355 |
| 2013/0208385 A1* | 8/2013 | Salcedo | H01L 23/60 361/111 |
| 2013/0242448 A1* | 9/2013 | Salcedo | H01L 27/0259 361/111 |
| 2013/0270605 A1* | 10/2013 | Salcedo | H01L 27/0262 257/120 |
| 2013/0277745 A1* | 10/2013 | Tsai | H01L 27/0259 257/355 |
| 2013/0320498 A1* | 12/2013 | Salcedo | H01L 29/747 257/565 |
| 2014/0138735 A1* | 5/2014 | Clarke | H01L 29/0692 257/124 |
| 2014/0225228 A1* | 8/2014 | Salcedo | H01L 27/0921 257/575 |
| 2014/0339601 A1* | 11/2014 | Salcedo | H01L 27/0262 257/140 |
| 2014/0367783 A1* | 12/2014 | Hwang | H01L 27/0259 257/360 |
| 2014/0376133 A1* | 12/2014 | Lin | H01L 27/0259 361/56 |
| 2015/0162400 A1* | 6/2015 | Yano | H01L 29/0619 257/337 |
| 2015/0221629 A1* | 8/2015 | Besse | H01L 29/7436 257/140 |
| 2015/0380483 A1* | 12/2015 | Mallikarjunaswamy | H01L 29/0619 257/494 |
| 2016/0204096 A1* | 7/2016 | Zhao | H01L 21/8222 327/428 |
| 2016/0261110 A1* | 9/2016 | Ivanov | H01L 27/0262 |
| 2016/0300830 A1* | 10/2016 | Salcedo | H01L 27/0259 |

* cited by examiner

INTEGRATED CIRCUIT WITH TRIPLE GUARD WALL POCKET ISOLATION

FIELD

Disclosed embodiments relate to junction isolation structures on integrated circuits and in some embodiments to junction isolated electrostatic discharge protection circuits for protecting integrated circuits.

BACKGROUND

The various circuit components on an integrated circuit generally need some form of isolation from one another. Commonly, p-n junction isolation is used to electrically isolate electronic components, such as transistors whether MOS or bipolar, on an integrated circuit by surrounding the respective components or groups of components with p-n junctions that are reverse biased during operation.

Some integrated circuits can experience unbalanced electrostatic charge which can cause an electrostatic discharge (ESD) if the electrical charge is balanced uncontrolled and fast. For integrated circuits (ICs), ESD reaching certain nodes may have significant impact on product quality and production yields. The discharge current of an ESD event may damage or destroy gate dielectrics (e.g., gate oxides), pn junctions and the metallization of ICs. For example, an ESD event may occur due to a charged body touching an IC or a charged IC touching a grounded surface.

NMOS transistors are commonly used for ESD protection. NMOS transistors offer ESD protection through activation of their parasitic NPN bipolar transistor. When a significant amount of current (e.g. ESD current) is forced to flow into an NPN transistor (e.g. collector-to-emitter), typically an IV-characteristic with a negative differential resistance area ("snapback" as it is generally called) is observed. Vt1 generally denotes the trigger voltage of snapback and Vt2 the trigger voltage of second breakdown (thermal destruction). Often $Vt_1$ is larger than $Vt_2$. In this case, Vt1 represents the maximum voltage that drops across the ESD protection element (or ESD cell) and causes overvoltage stress to circuits to be protected. Therefore it is desirable to reduce Vt1 as much as possible. This can be done by biasing the gate of the NMOS (e.g., Vgs) or by injecting current into the base of the parasitic NPN transistor ($I_B$).

The holding voltage (Vh) represents the minimum voltage reached after snapback. If the Vh of an ESD transistor meant to protect circuitry coupled to a power supply pin is less than the maximum supply voltage, a voltage spike superimposed on the supply voltage may trigger the ESD transistor and the low Vh value will prevent the ESD transistor from being turned-off until it is thermally destroyed. To avoid this "latch-up" risk the Vh value should be greater than the maximum supply voltage used by the IC.

One first known ESD cell comprises a "substrate" triggered ESD NMOS transistor along with its parasitic NPN transistor and a simple transient trigger circuit such as a capacitor in series with a resistor coupled to the body of the NMOS (and thus to the base of the parasitic NPN transistor). The trigger circuit injects current into the base of the parasitic NPN transistor when the PAD voltage coupled to the drain of the NMOS transistor is suddenly increased due to an ESD event to the PAD with respect to the REF terminal which is coupled to the source of the NMOS transistor. A diode in parallel to the NMOS transistor is also provided for negative ESD current conduction. This first known ESD cell is not an isolated cell.

A second known ESD cell comprises a "substrate" triggered NMOS transistor that comprises the first known ESD cell with an added low-side diode in series between the source of the NMOS transistor and the REF terminal. This ESD cell has a Vh value that is generally sufficiently increased by the voltage drop that is developed upon an ESD event across the low-side diode. This second known ESD cell is junction isolated with all its components (NMOS transistor, low-side diode and the diode in parallel to the NMOS transistor) positioned in individual NBL/NWELL isolation regions separated and thus junction isolated from one another by p-type guard rings. The low-side diode reduces the (pumping) current injected into the base of the parasitic NPN transistor and hence raises the Vt1 of the ESD cell.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize conventional junction isolation can fail to provide the needed isolation for some integrated circuit (IC) devices under certain conditions. For example, for electrostatic discharge prevention circuits (ESD cells) that include junction isolated stacked adjacent ESD components comprising an n-channel metal-oxide-semiconductor field-effect (NMOS) transistor in series with a diode there can be an undesirable interaction between these stacked components due to uncontrolled leakage current. Such leakage can result in premature ESD induced fails and destructive latch-up during normal operation of ESD protected ICs.

Disclosed embodiments include an IC having adjacent components located in the semiconductor surface (e.g., diodes, bipolar transistors, SCRs, MOS transistors, resistors, capacitors) that are isolated from one another by a disclosed triple region (npn) guard wall pocket in-between these components. Disclosed embodiments also include ESD cells that have a high-side (HS) high-injection component that in operation is biased at a higher voltage between a low-side (LS) component biased at a lower voltage than the HS component such as MOS transistor and the HS terminal (referred to herein as PAD), and a disclosed npn guard wall pocket is added between the HS component and the LS component. During circuit operation the npn guard wall's respective junctions are all reversed biased. The biased disclosed npn guard wall pocket enables extracting charge carriers (both electrons and holes) injected by the adjacent high-injection component when biased at a higher voltage and thus prevents the charge carriers from reaching the LS component through an electrical force provided by the repelling electric fields generated. Disclosed ESD cells having biased npn guard wall pockets thus minimize the undesirable interactions between the HS high-injection component and the LS component.

BRIEF DESCRIPTION OF THE DRAWINGS

Reference will now be made to the accompanying drawings, which are not necessarily drawn to scale, wherein.

DETAILED DESCRIPTION

Figure 1:
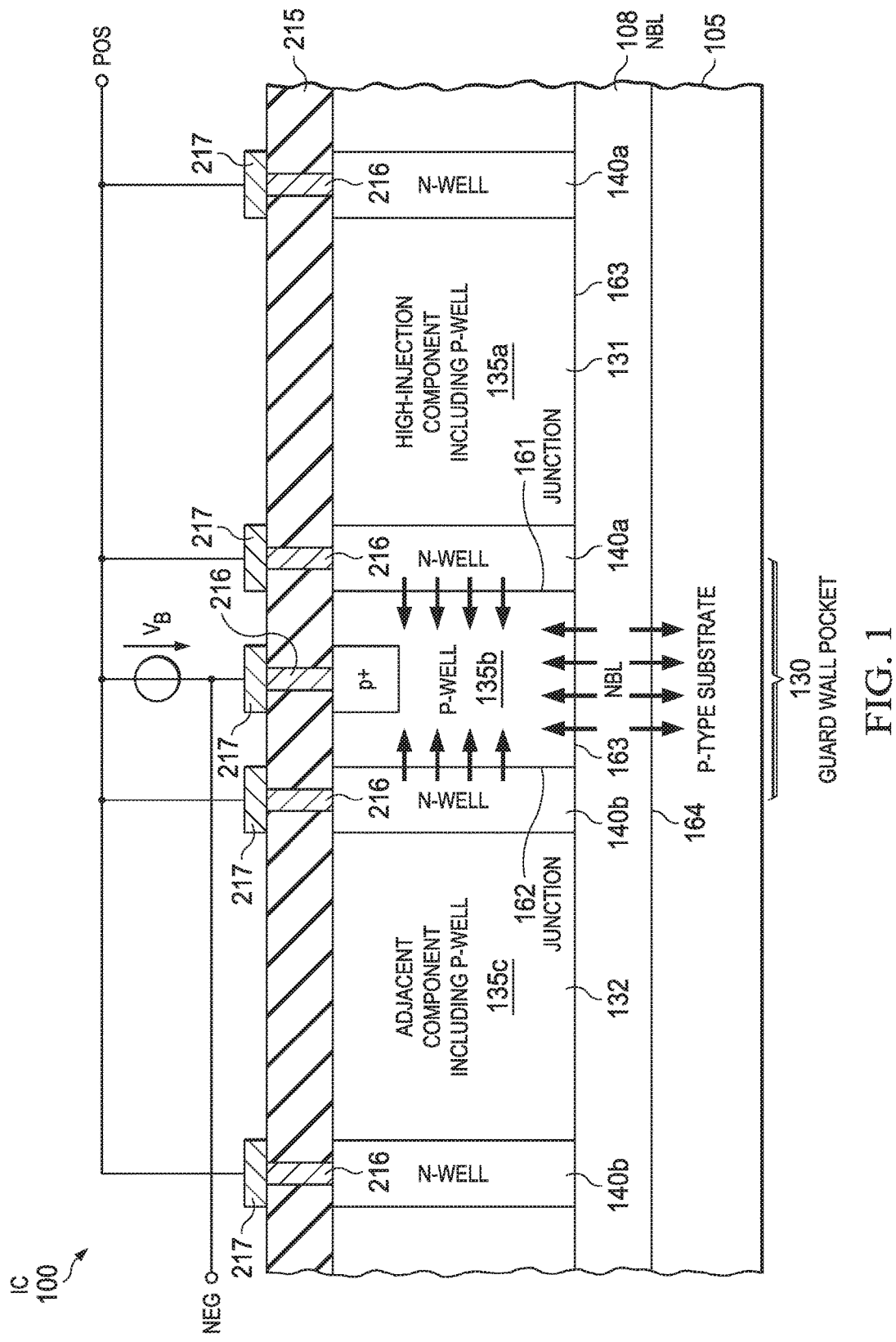
FIG. 1 shows a generalized top-down cross-sectional diagram of an IC including an isolated high-injection component and another isolated adjacent component that are separated by a disclosed npn guard wall pocket between these components, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 shows a general top-down cross-sectional diagram of an IC 100 that includes a disclosed npn guard wall pocket 130. On the substrate 105 shown as a p-type substrate there is a blanket n-type buried layer (NBL) 108 generally formed by ion implantation. The p-wells shown as first pwell 135a, second pwell 135b, and third pwell 135c may be provide by p-epi layer alone or by a boron implant, and are all separated by n-well rings include a first nwell ring 140a of nwell 140 and a second nwell ring 140b of nwell 140 shown which contact the NBL 108 and form a plurality of enclosed regions that each include different components therein shown as high injection component 131 surrounded by the first n-well ring 140a and adjacent component 132 surrounded by the second n-well ring 140b. The components can comprise groups of components. The first and second nwell rings 140a, 140b are typically implanted using masking as needed in a grid pattern on top of the NBL 108 to form surrounded individual regions to include therein the different components 131, 132.

"High-injection" as used herein denotes a concentration of electrons and holes that exceeds the local doping concentration. In order to reach high-injection conditions a forward-biased pn-junction is needed. For example, when the doping concentration of p-epi/pwell is $10^{16}$ cm$^{-3}$ a concentration of electrons and holes of $10^{17}$ cm within this p-epi/pwell indicates "high-injection". The high-injection component 131 can generally be any component that comprises at least one n-type and one p-type region, for example a pn diode, bipolar transistor, silicon controlled rectifier (SCR) or insulated-gate bipolar transistor (IGBT). Furthermore, also MOS transistors can cause high-injection due to their integrated body diode. The adjacent component 132 can be any component that comprises at least one p-type region, for example a pn diode, bipolar transistor, MOS transistor, IGBT, SCR, resistor or capacitor.

Between the high-injection component 131 and the other component 132 a disclosed npn guard wall pocket 130 is positioned. The npn guard wall pocket 130 as shown comprises a wall of the second nwell ring 140b, the second pwell 135b and a wall of the first nwell ring 140a. It is noted that all disclosed doping can be changed to the opposite doping type, to produce a disclosed pnp guard wall pocket such as changing the substrate from p-type to n-type, the NBL 108 to a p-type buried (PBL) layer, the p-epi to n-epi, and separating and negatively biasing p-well rings instead of positively biasing nwell rings, etc.

While the n-well rings 140a and 140b and NBL 108 are connected by metal filled vias 216 through a pre-metal dielectric (PMD) layer 215 and metal lines 217 to enable connection to an external positive voltage shown as POS, the p-well 135a of the npn guard wall pocket 130 is connected by vias 216 and metal lines 217 to enable connection to a negative external voltage shown as NEG. As a result, during operation all pn-junctions shown as a first pn junction 161, second pn junction 162 and third pn junction 163 of the npn guard wall pocket 130 are all reverse biased and repelling E-fields for both electrons and holes diffusing from the high-injection component 131 towards the other component 132 are established. While electrons are laterally blocked and extracted by the first pn-junction 161, holes are blocked and extracted by the second pn-junction 162. As vertical diffusion is concerned electrons are blocked and extracted by the pn-junction 163 between the p-epi/pwell 135b and the n-type buried layer 108 and holes are blocked and extracted by the pn-junction 164 between the p-type substrate 105 and the NBL 108.

In operation generally the voltage applied to the nwell rings 140a and 140b need to be biased to a level greater (more positive) as compared to the largest voltage used to bias any of the components 131 and 132. Otherwise, the nwell rings 140a, 140b can act as the cathode of a forward biased diode and cause large leakage currents.

Figure 2A:
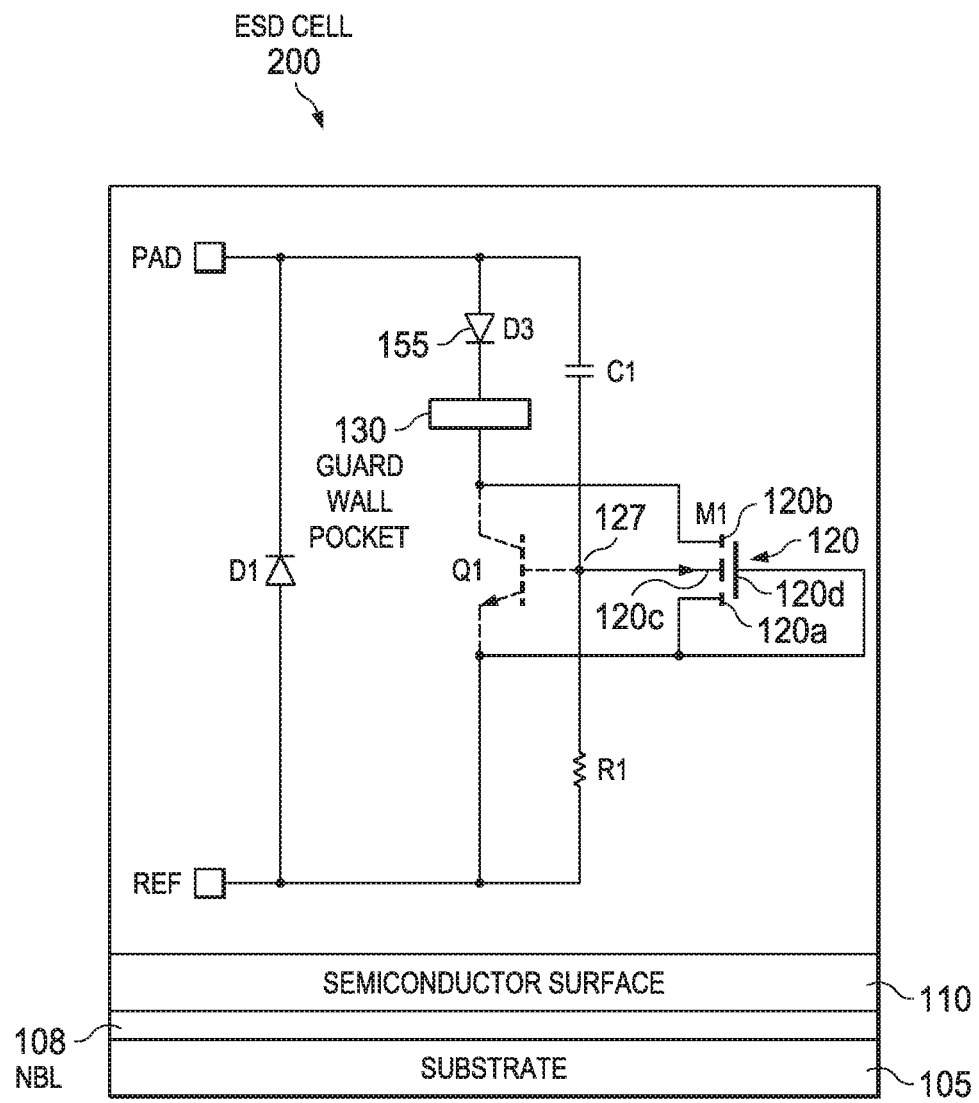
FIG. 2A is a simplified circuit diagram showing an example ESD protection cell having a HS diode and a disclosed npn guard wall pocket between the HS diode and a LS component shown as an NMOS device, according to an example embodiment.
Figure 2B:
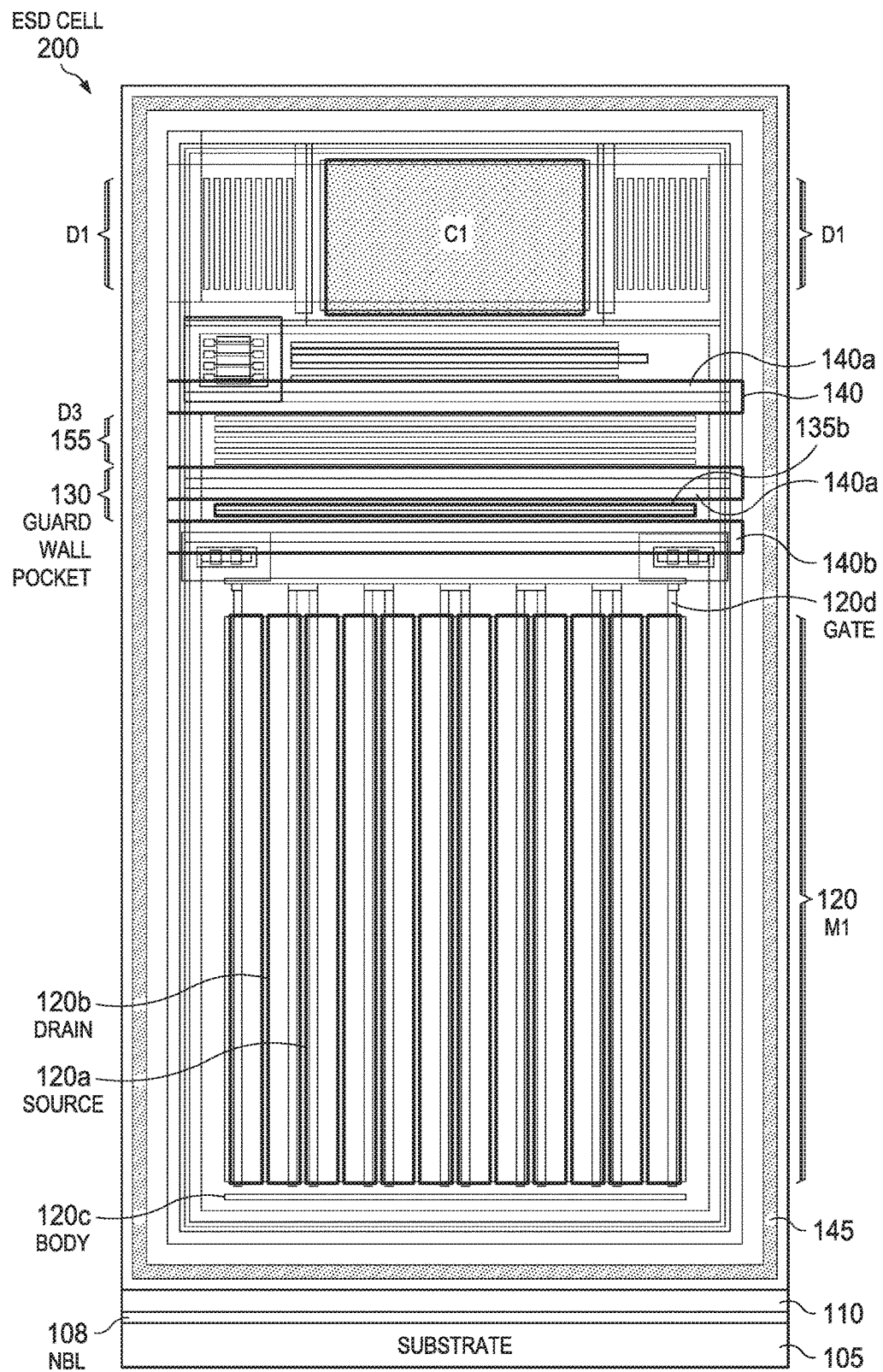
FIG. 2B is top view of an example layout for the ESD protection cell shown in FIG. 2A, according to an example embodiment.

FIG. 2A is a simplified schematic and FIG. 2B an example layout of an example ESD cell 200 comprising a "substrate" triggered NMOS transistor shown as M1 120 with an integrated HS diode shown as D3 155 between the drain of M1 120 and the terminal biased+(relative to a REF terminal) during operation shown as PAD. ESD cell 200 uses a HS diode D3 155 rather than a conventional LS diode to minimize detrimental effects on the triggering of the M1's 120 parasitic NPN transistor. The ESD cell 200 includes a substrate 105 having a semiconductor surface 110 including an NBL 108 therein. In one embodiment the substrate 105 is a p+ substrate and the semiconductor surface 110 is a p-epi layer that may be about 15 μm to 40 μm thick.

The substrate 105 is typically boron doped from $1\times10^{14}$ cm$^{-3}$ to $1\times10^{16}$ cm$^{-3}$, and the semiconductor surface 110 (e.g., p-epi layer) can have a doping level from $3\times10^{14}$ cm$^{-3}$ to $3\times10^{16}$ cm$^{-3}$ and a thickness of 3 µm to 10 µm. The substrate 105 and the semiconductor surface 110 can both comprise silicon, and can also comprise other materials. The NBL 108 is typically antimony (Sb) doped in a concentration from $1\times10^{18}$ cm$^{-3}$ to $1\times10^{19}$ cm$^{-3}$ diffusing about 0.5 µm to 2 µm into the p-epi layer. The p-well 135 is typically boron doped in a concentration from $10^{15}$ cm$^{-3}$ to $10^{17}$ cm$^{-3}$ and the n-well can be phosphorus doped in a concentration from $10^{16}$ cm$^{-3}$ to $10^{19}$ cm$^{-3}$.

ESD cell 200 includes at least one NMOS transistor shown as M1 120 formed in the semiconductor surface 110 having a source 120a and a drain 120b separated by a p-type body 120c and a gate stack including gate electrode 120d over a gate dielectric over the length of the body (see source 120a, drain 120b, gate electrode 120d and body 120c in FIG. 2B described below). M1 120 as shown in FIG. 2B is a multi-finger NMOS with 12 gate electrodes 120d (e.g., polysilicon gates), 7 sources 120a, 6 drains 120b and 2 bodies 120c all arranged as fingers.

Figure 3:
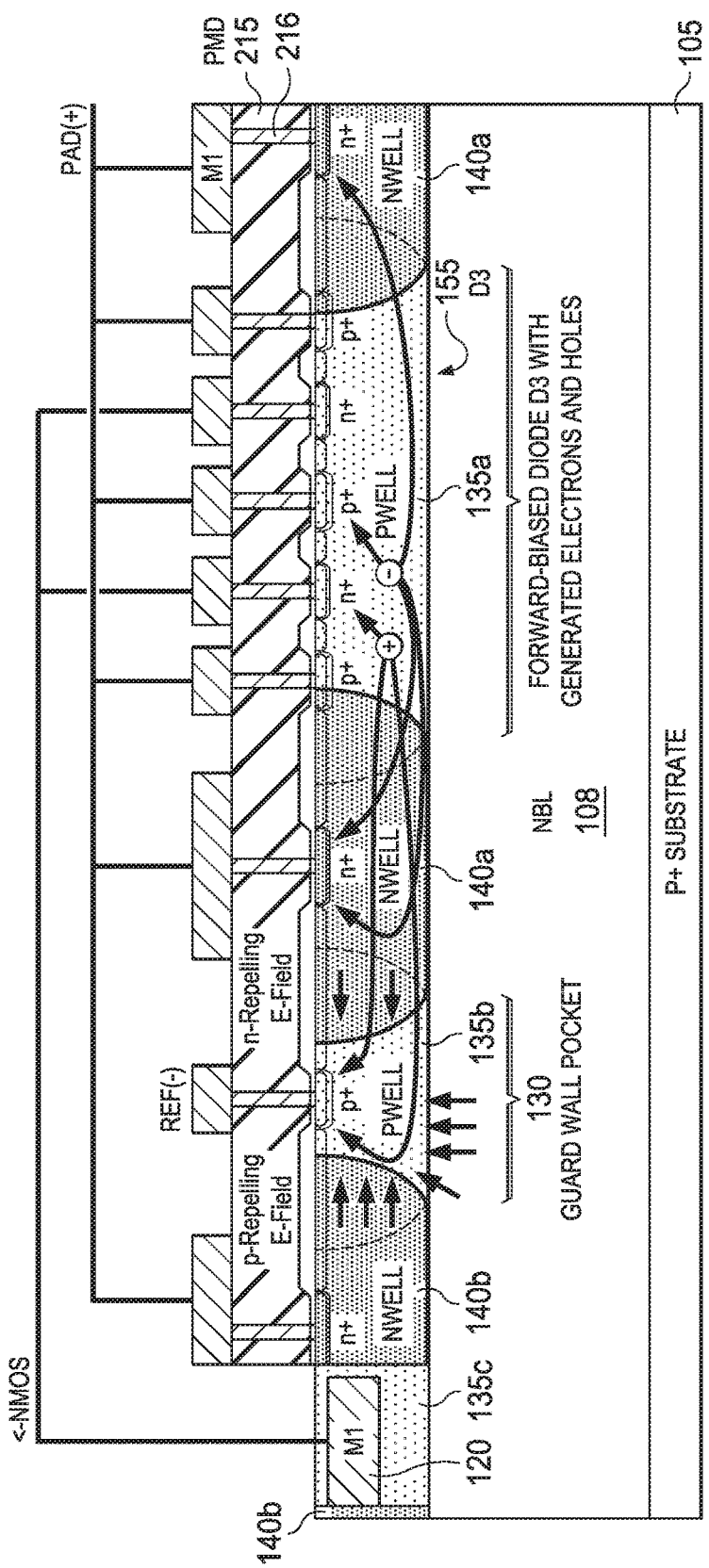
FIG. 3 is a top down cross-sectional diagram of portion of the ESD cell shown in FIGS. 2A and 2B having a HS diode and an npn guard wall pocket between the HS diode and the NMOS device that depicts the trapping of generated carriers originating from D3, according to an example embodiment.

A D3 155 is formed in the semiconductor surface 110 and includes at least one anode (p-type) and at least one cathode (n-type) within a pwell (see first pwell 135a in FIG. 3 described below) having nwell ring 140a contacting the NBL 108 (the contacting is shown in FIG. 3). An npn-type guard wall pocket 130 (e.g., created by ion implantation) is positioned between M1 120 and D3 155 to decouple D3 155 and M1 120 that otherwise would be influenced during operaton by the high-injection plasma of electrons and holes of the forward biased D3 155. Npn Guard wall pocket 130 is generally formed by a selective boron ion implantation. The npn guard wall pocket 130 is deep enough to reach the NBL 108 in FIG. 3.

ESD cell 200 includes a transient trigger circuit comprising a capacitor C1 in series with a resistor R1 having its intermediate node 127 connected to the bulk terminal (p-body 120c) of the M1 120 for injecting current into the base of the parasitic NPN bipolar shown as Q1 when the PAD voltage coupled to the drain of M1 120 is suddenly increased due to an ESD event applied to the PAD with respect to the REF terminal coupled to the source of M1 120. A diode shown as D1 between PAD and REF is provided for negative ESD current conduction.

As shown in FIG. 2B all components of the ESD cell 200 comprising D1, D3, M1 120 are placed in different nwell ring positions on the NBL 108 that is connected to the PAD (for biasing+relative to REF) that is all surrounded by one outer p-type substrate guard ring 145 that reaches the substrate 105 which is also p-type to provide junction isolation. This outer junction isolation arrangement helps avoid undesirable cross-coupling between the components of the ESD cell and other components placed adjacent to the ESD cell. D3 155 functions to increase the holding voltage (Vh) of the ESD cell 200 sufficiently without impairing the trigger mechanism (C1 and R1) for M1 120. C1 can be a polysilicon to-polysilicon capacitor, or other capacitor type such as polysilicon on a dielectric on a doped layer in a p-epi/pwell surrounded by an nwell ring on the NBL 108.

FIG. 3 is a top-down cross-sectional view of a portion of the ESD cell 200 including a metal 1 (M1) pattern having vias 216 connecting through a pre-metal dielectric (PMD) layer 215 to various contacts on the semiconductor surface 110 including to the anode and cathode of D3 155 and the npn guard wall pocket 130 separating D3 155 from M1 120. Another level of interconnect (e.g., metal 2 or metal 3) is schematically shown connecting to various nodes. FIG. 3 also depicts the repelling E-fields and the trapping of carriers (holes (+) and electrons (−)) generated by the forward biased D3 155 during ESD cell operation.

Under the forward bias conditions shown (where the PAD as shown in FIG. 3 is positively biased with respect to REF) a high-injection "plasma" of electrons and holes fills the area of and around D3 155. While the electrons are being collected by the surrounding NBL 108/nwell rings 140a, holes may diffuse as minority carriers through the first nwell ring 140a. To prevent the holes from reaching M1 120, the npn guard wall pocket 130 that has its second pwell 135b connected to the REF terminal which is the—terminal is provided. The second pwell 135b of the npn guard ring pocket 130 is being connected to the (−) biased REF terminal to extract holes from the npn guard wall pocket 130. Moreover, the repelling electric field (E-field) prevents holes from reaching M1 120. Under negative bias D3 155 provides blocking and the ESD current is conducted by D1 (D1 is shown in FIG. 2A).

Disclosed ESD cells thus take advantage of both drift and diffusion characteristics of electrons and holes to trap carriers on their way to their adjacent circuit components (here M1 120 and its parasitic NPN) and to block the path of the remaining charge carriers to M1 120. Regarding fabrication of disclosed ESD cells, process steps readily available in conventional junction-isolated IC technologies (i.e., lithography, etching, deposition, chemical mechanical planarization, oxidation, ion implantation, and diffusion) allow a compact implementation of disclosed ESD cells within existing process steps. For example, the doping for forming the respective regions of the npn guard wall pocket 130 can come from existing nwell and pwell ion implants.

Disclosed embodiments includes a method of forming a semiconductor device. A substrate is provided having a semiconductor surface doped a second dopant type including a BL doped a first dopant type. First well regions doped the second dopant type arranged as a first well region and a second well region are formed on top of the BL. Second doped regions doped the first dopant type are formed on top of and contacting the BL arranged as a first well ring and a second well ring around the first and the second well regions, respectively.

At least one high-injection component is formed including the first well region surrounded by the first well ring. At least one other component is formed including the second well region surrounded by the second well ring. An npn or pnp guard wall pocket including a wall of the second well ring, the second well region, and a wall of the first well ring is provided between the high-injection component and the other component. The first dopant type can be n-type and the second dopant type p-type, or the first dopant type p-type and the second dopant type n-type. As noted above in one particular embodiment the high-injection component can comprise a diode and the other component can comprise a MOSFET.

Figure 4:
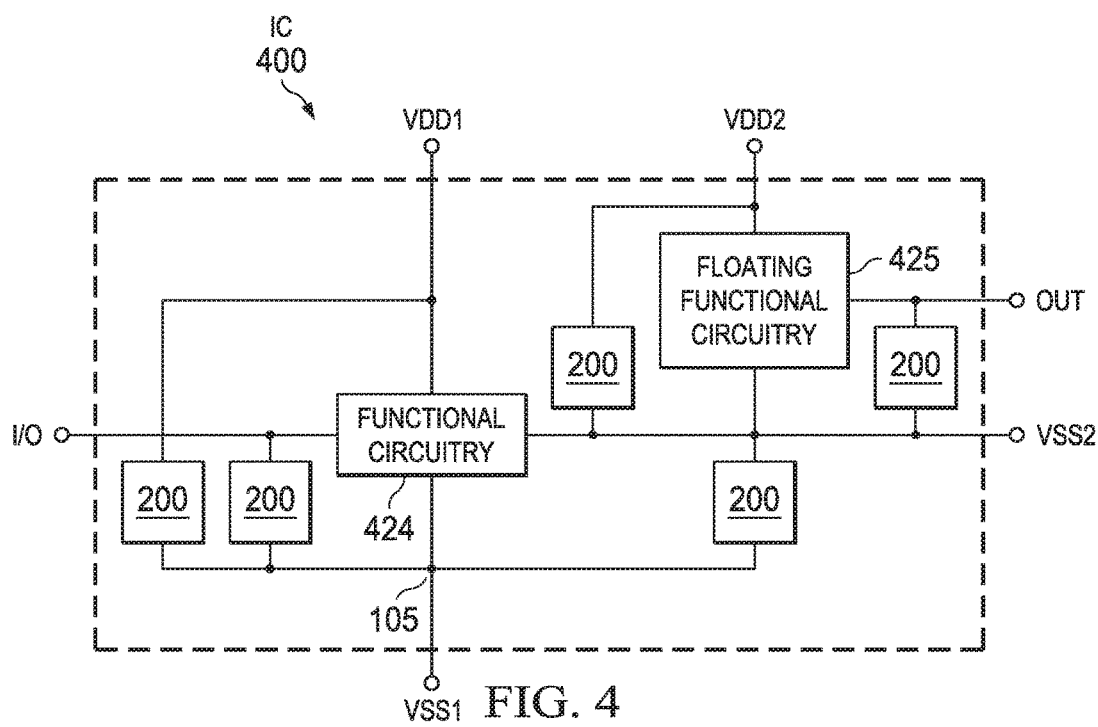
FIG. 4 illustrates a high level depiction of an example ESD protected IC into which disclosed ESD cells are incorporated to protect terminals of the IC, according to an example embodiment.

FIG. 4 is a high level depiction of a construction of an IC 400 into which disclosed ESD cells 200 functioning as ESD protection devices are incorporated (integrated) to protect one or more terminals of the IC, according to an example embodiment. However, disclosed ESD cells can also be discrete devices.

IC 400 includes functional circuitry 424, which is integrated circuitry operating with reference to the substrate 105 that may be p-type that realizes and carries out desired functionality of IC 400, such as that of a digital IC (e.g., digital signal processor) or analog IC (e.g., amplifier or a power converter), such as a BiMOS IC. IC 400 is also shown including functional circuitry 425, which is integrated circuitry operating with reference to a floating reference voltage that realizes and carries out another desired functionality of IC 400, such as that of a digital IC (e.g., digital signal processor) or analog IC (e.g., amplifier or a power converter), such as a BiMOS IC. The capability of functional circuitry provided by IC 400 may vary, for example ranging from a simple device to a complex device. The specific functionality contained within functional circuitry 424 and 425 is not of importance to disclosed embodiments.

IC 400 also includes a number of external terminals, by way of which functional circuitry 424 and 425 carries out its function. A few of those external terminals are illustrated in FIG. 4. It is to be understood that the number of terminals and their function can also vary widely. In the example of IC 400 shown in FIG. 4, one terminal shown operates as common input and output terminal (I/O), by way of which functional circuitry 424 can receive incoming signals and can generate outputs, as well known in the art. A dedicated output terminal OUT is also shown in FIG. 4 for IC. The terminal OUT is connected to the floating functional circuitry 425. Power supply terminals VDD1 and VDD2 receive a positive power supply voltage in this example, while negative supply terminal VSS1 which connects the substrate of the IC is provided to receive a reference voltage, such as system ground. Furthermore, the negative supply terminal VSS2 is provided to receive a floating reference voltage as used e.g. in level-shifting applications.

IC 400 includes an instance of ESD cell 200 connected to each of its terminals except for the substrate ground terminal VSS1 which acts as common reference. Each ESD cell 200 is connected to its corresponding terminal in parallel with the functional circuitry 424 and 425. ESD cells 200 are also connected to power supply and reference voltage terminals VDD1, VDD2 and VSS2, in parallel with functional circuitry 424 and 425. However, in some applications, some pins of the IC device being protected will be self-protecting, such as diode protected power supply pins. Pins also can be protected against different levels of ESD strike (Human Body Model (HBM), Charged Device Model (CDM), IEC, etc.).

Disclosed ESD cells are generally applicable to a wide variety of junction isolated adjacent high-injection level components, and provide a compact layout and inexpensive implementation. One example application is to power converters products. However, potentially any junction isolated high-injection component can benefit from disclosed embodiments.

EXAMPLES

Disclosed embodiments are further illustrated by the following specific Examples, which should not be construed as limiting the scope or content of this Disclosure in any way.

Figure 5:
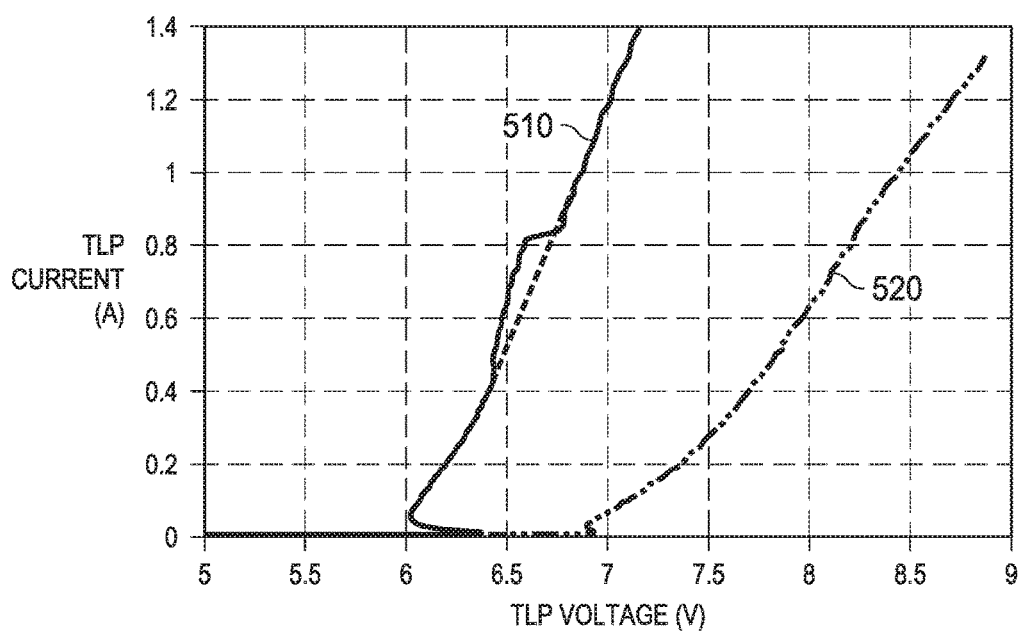
FIG. 5 shows measured Transmission-Line Pulse (TLP) characteristics of a known junction isolated ESD protection cell having no series diode referred to in the Background as a first known ESD cell and that of a disclosed ESD protection cell having a HS series diode and a disclosed npn guard wall pocket between the HS series diode and the NMOS based on the ESD cell shown in FIGS. 2A and 2B.

FIG. 5 shows measured TLP characteristics of a known junction isolated ESD cell having no series diode referred to in the Background as a first known ESD cell shown as 510 and that of a disclosed ESD cell having a HS diode and an npn guard wall pocket between the HS series diode and the NMOS device (based on the ESD cell 200 shown in FIGS. 2A and 2B) shown as 520. The voltage drop for the disclosed ESD cell can be seen to be increased (higher TLP voltage curve) by the voltage drop of a forward biased diode operated under high-injection conditions with respect to the known junction isolated ESD cell.

Disclosed embodiments can be used to form a semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS, BCD (Bipolar, CMOS and Double-diffused MOS transistor (DMOS)) and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure. For example, although a diode and an NMOS transistor are generally described above, it is clear to one having ordinary skill in the art to use this information for any pair of one component operated under high injection conditions and another adjacent component, by n-doped regions being substituted by p-doping and vice versa.

The invention claimed is:

1. An electrostatic discharge (ESD) cell, comprising:
a substrate having a semiconductor surface with an n-buried layer (NBL) therein;
pwell regions arranged as a first, second and third pwell region on top of said NBL;
an nwell on top of and contacting said NBL arranged as a first nwell ring around said first pwell region and a second nwell ring around said third pwell region;
a low side n-channel metal-oxide-semiconductor field-effect transistor (M1) formed within said third pwell region and surrounded by said second nwell ring, said M1 having a drain and a source separated by a portion of said third pwell region as a body and a gate stack over said body, wherein said source is coupled to a first terminal (REF);
a high-side (HS) diode formed within said first pwell region and surrounded by said first nwell ring, the HS diode having at least one anode coupled to a second terminal (PAD) and at least one cathode coupled to said drain, and
an npn guard wall pocket including a wall of said second nwell ring, said second pwell region, and a wall of said first nwell ring between said HS diode and said M1.

2. The ESD cell of claim 1, further comprising an outer p-type substrate guard ring surrounding said first and said second nwell rings and said NBL.

3. The ESD cell of claim 1, further comprising an RC trigger circuit including a resistor (R1) and a capacitor (C1) in series between said PAD and said REF, where an intermediate node of said RC trigger circuit is coupled to said body.

4. The ESD cell of claim 1, further comprising a diode D1 between said PAD and said REF for negative ESD current conduction.

5. The ESD cell of claim 1, wherein the first pwell region is surrounded by the first nwell ring but not the second nwell ring and the third pwell region is surrounded by the second nwell ring but not the first nwell ring.

6. An integrated circuit (IC), comprising:
a substrate having a p-epitaxial (p-epi) layer thereon with an n-buried layer (NBL) therein;

pwell regions arranged as a first, second and third pwell region on top of said NBL;
an nwell on top of and contacting said NBL arranged as a first nwell ring around said pwell regions and a second nwell ring around said pwell regions;
functional circuitry formed using said p-epi layer configured to realize and carry out a functionality having a plurality of terminals including at least a first terminal and a ground terminal;
at least one bipolar electrostatic discharge (ESD) protection cell (ESD cell) formed in said p-epi layer coupled between said first terminal and said ground terminal in parallel to said functional circuitry, said ESD cell including:
  a low side n-channel metal-oxide-semiconductor field-effect transistor (M1) formed within said third pwell region and surrounded by said second nwell ring, said M1 having a drain and a source separated by a portion of said third pwell region as a p-type body and a gate stack over said body, wherein said source is coupled to a first terminal (REF);
  a high-side (HS) diode formed within said first pwell region surrounded by said first nwell ring having at least one anode coupled to a second terminal (PAD) and at least one cathode coupled to said drain, and
  an npn guard wall pocket including a wall of said second nwell ring, said second pwell region, and a wall of said first nwell ring, between said HS diode and said M1.

7. The IC of claim 6, further comprising an outer p-type substrate guard ring surrounding said nwell rings and said NBL.

8. The IC of claim 6, further comprising an RC trigger circuit including a resistor (R1) and a capacitor (C1) in series between said PAD and said REF, where an intermediate node of said RC trigger circuit is coupled to said body.

9. The IC of claim 6, wherein each of said M1 and said HS diode are within dedicated rings of said nwell.

10. The IC of claim 6, wherein the first pwell region is surrounded by the first nwell ring but not the second nwell ring and the third pwell region is surrounded by the second nwell ring but not the first nwell ring.

* * * * *